(12) United States Patent
Van Arendonk et al.

(10) Patent No.: US 9,864,071 B2
(45) Date of Patent: Jan. 9, 2018

(54) BONDING METHOD WITH PERIPHERAL TRENCH

(71) Applicant: TELEDYNE DALSA, INC., Waterloo (CA)

(72) Inventors: Anton Petrus Maria Van Arendonk, Waterloo (CA); Peter Goossens, Waterloo (CA)

(73) Assignee: TELEDYNE DALSA, INC. (CA)

( * ) Notice: Subject to any disclaimer, the term of this patent is extended or adjusted under 35 U.S.C. 154(b) by 0 days.

(21) Appl. No.: 15/313,652

(22) PCT Filed: Jul. 25, 2014

(86) PCT No.: PCT/CA2014/000584
§ 371 (c)(1),
(2) Date: Nov. 23, 2016

(87) PCT Pub. No.: WO2016/011522
PCT Pub. Date: Jan. 28, 2016

(65) Prior Publication Data
US 2017/0131415 A1    May 11, 2017

(51) Int. Cl.
*G01T 1/20* (2006.01)
*G01T 7/00* (2006.01)
*F16B 11/00* (2006.01)

(52) U.S. Cl.
CPC .......... *G01T 1/2018* (2013.01); *F16B 11/006* (2013.01); *G01T 7/00* (2013.01)

(58) Field of Classification Search
CPC ... G01T 1/2018; G01T 1/2002; G01T 1/2006; G01T 1/2928
See application file for complete search history.

(56) References Cited

U.S. PATENT DOCUMENTS

| | | | | |
|---|---|---|---|---|
| 5,727,778 A | * | 3/1998 | Nodar | B25B 1/205 269/296 |
| 7,582,879 B2 | * | 9/2009 | Abenaim | G01T 1/2985 250/370.11 |
| 8,614,421 B2 | | 12/2013 | Van Arendonk et al. | |
| 2003/0132681 A1 | * | 7/2003 | Kondo | H02K 15/03 310/239 |
| 2008/0083877 A1 | * | 4/2008 | Nomura | G01T 1/2018 250/370.11 |
| 2009/0108473 A1 | | 4/2009 | Wang et al. | |

FOREIGN PATENT DOCUMENTS

JP      61236280 A   * 10/1986

OTHER PUBLICATIONS

International Search Report issued in PCT/CA2014/000584.

* cited by examiner

Primary Examiner — Kiho Kim
(74) Attorney, Agent, or Firm — McGuire Woods LLP

(57) ABSTRACT

A device has planar components forming part of a stack on a support frame, such as a substrate and upper layer, for example a fiber optic scintillator/fiber optic plate, bonded together by an adhesive layer of well-defined thickness. The device is made by providing a trench in a peripheral recess extending in a marginal portion of the support frame. Excess adhesive is applied to one of the planar components, which are then brought together such that the adhesive layer of well-defined thickness is formed between the two components and surplus adhesive is collected in the trench.

25 Claims, 1 Drawing Sheet

BONDING METHOD WITH PERIPHERAL TRENCH

CROSS-REFERENCE TO RELATED APPLICATIONS

This application is the national stage application of and claims priority to International Patent Application No. PCT/CA2014/000584 filed on Jul. 25, 2014, the disclosure of which is incorporated by reference herein in its entirety.

FIELD OF THE INVENTION

This invention relates to the manufacture of integrated devices with planar components bonded together by an adhesive layer of well-defined thickness, and in particular but not exclusively to integrated X-ray detectors.

BACKGROUND OF THE INVENTION

In the manufacture of large medical X-ray detectors many challenges have to be overcome. Planar components subject to stringent flatness requirements must be bonded together by an adhesive layer of well-defined thickness without air pockets. This is particular true of the image sensor and the interface layer that goes on top. In order to completely fill the gap between the two planar components with adhesive, considerably more adhesive must be applied than is actually required. As the planar components are brought together the surplus adhesive is squeezed out of the sides. This surplus adhesive must be removed since otherwise it risks contaminating the remainder of the detector. The problem is compounded by the fact that random surface effects can lead to an unpredictable wicking path, so it is not known in advance where the surplus adhesive will end up.

US patent publication No. 2009/0108473 discloses a method wherein excess adhesive flows into a recessed region to prevent material from creeping up the sides of an integrated circuit chip.

SUMMARY OF THE INVENTION

Embodiments of the invention address the above problems by providing a peripheral trench to collect the surplus adhesive.

According to the present invention there is provided a method of making an integrated device having upper and lower planar components forming part of a stack and bonded together by an adhesive layer of well-defined thickness, the method comprising: providing a trench within a peripheral recess formed within a marginal portion of a support frame for said stack; applying an excess amount of adhesive to one of said planar components; bringing said upper and lower planar components into proximity such that said adhesive layer of well-defined thickness is formed between said upper and lower planar components; and collecting surplus adhesive in said trench.

The integrated device may, for example, be an X-ray detector, in which case the upper planar component may be an interface layer and the lower component may be the silicon substrate. The stack may be bonded onto an aluminum support frame. The peripheral trench may be milled into the supporting frame.

It will be understood that in this context the orientational expressions, such as upper and lower, relate to the device in the orientation in which it is commonly illustrated, but are not per se intended to be limiting.

The expression "well-defined" in this context means that the adhesive layer has a thickness that is precisely controlled in accordance with the design requirements of the device, for example that it has a particular thickness with a predefined tolerance.

According to another aspect of the invention there is provided an integrated device comprising: a planar substrate forming part of a stack bonded onto a support frame, an upper layer bonded onto said planar substrate by an adhesive layer of well-defined thickness, and wherein said support frame has peripheral recess formed in a marginal portion thereof below said planar substrate and a trench within said peripheral contains surplus adhesive.

BRIEF DESCRIPTION OF THE DRAWINGS

The invention will now be described in more detail, by way of example only, with reference to the accompanying drawings, in which.

DESCRIPTION OF EMBODIMENTS OF THE INVENTION

Figure 1:
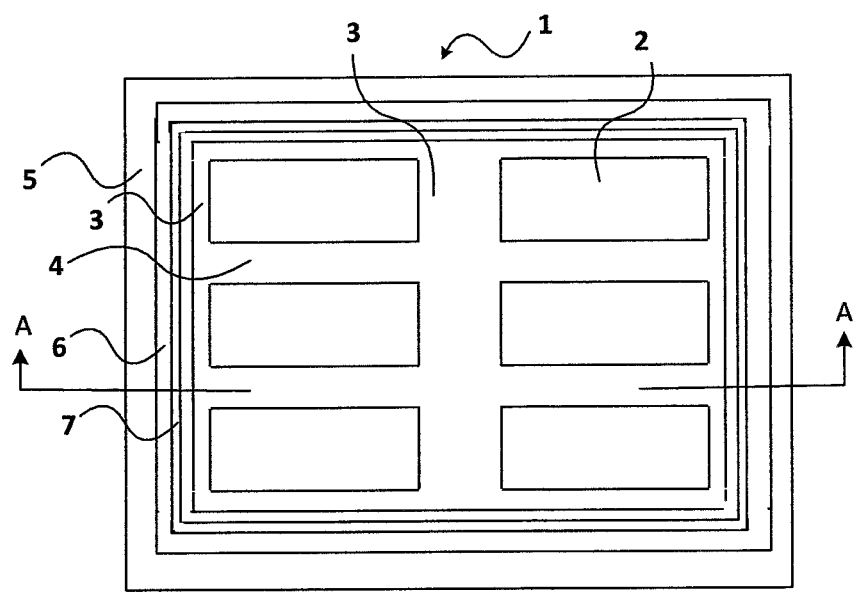
FIG. 1 is a plan view of a support frame for a sub-assembly forming part of an X-ray detector prior to application of the glass substrate.

FIG. 1 shows a stack comprising a generally planar support frame 1 for a large X-ray detector, which in this example is made of aluminum although other metals could be used. The support frame 1 is of unitary construction and comprises a grid of orthogonal grid members 3, 4 defining rectangular openings 2 in the metal support frame 1 surrounded by a marginal portion 5.

Figure 2:
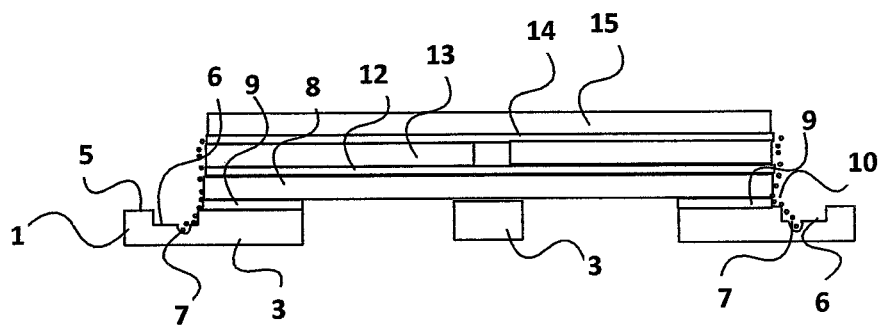
FIG. 2 is a cross sectional view taken along the lines A-A in FIG. 1 of the sub-assembly.

The marginal portion 5 along a pair of opposite sides of the support frame 1 includes a peripheral recess 6 into which is milled a trench 7, which as shown in FIG. 2 is U-shaped in cross section. It has been found that the U-shape is preferred as it is easier to manufacture, but other shapes such as V-shape could be employed.

A planar glass carrier 8 is glued onto the metal support frame 1 at the edges 1 by means of a layer of adhesive 9, such as a thermal curable epoxy adhesive. A suitable adhesive is EPO-TEK 301, but many other suitable adhesives are available. The viscosity, glass transition temperature, and curing method should be compatible with the substrate on top of the silicon. If the substrates on top of the glass carrier is transparent, it would be desirable to employ a UV curable adhesive.

Non-transparent silicon substrates 13, forming part of the stack, are then glued on top of the glass carrier 8 by a similar adhesive layer 12. The silicon substrates 13 form an image sensor. An interface layer 15, such as a fiber optic scintillator or fiber optic plate, is then glued on top of the silicon substrates 13 by an adhesive layer 14 of thermally curable adhesive such as EPO-TEK 301. It is important that this adhesive layer 14 have a well defined predetermined thickness. The layer of epoxy adhesive 14 is typically 80-150 microns thick.

After application of the adhesive layer 14 to one of the planar components, silicon substrates 13 or interface layer 15, for example the planar silicon substrate 13, the two planar components 13, 15 are brought together for curing. In order to ensure that the adhesive layer 14 has a well-defined thickness without air pockets a slight excess of adhesive is deliberately employed.

As the two components are brought together to the desired separation so as to leave the adhesive layer 14 of well-defined thickness, surplus adhesive 10 oozes out of the gap between the components 13, 15. The recess 6 and U-shaped trench 7 serve to enhance the wicking action to pull the adhesive clear of the planar substrate 13 and into the recess 6 whereupon it is wicked in to the trench 7. During curing the surplus adhesive 10 remains in place in the trench 7 and forms a solid innocuous mass that does not affect the other components of the device.

The use of the two-step configuration with the trench 7 within the recess 6 to collect the surplus adhesive 10 allows the desired separation of the planar components to be maintained without the presence of air pockets in the adhesive layer 14 and without adversely affecting other components of the complete assembly. The surplus adhesive is kept well clear of the non-transparent substrates 13 forming the image sensor.

The invention claimed is:

1. A method of making an integrated device having upper and lower planar components forming part of a stack and bonded together by an adhesive layer of well-defined thickness, comprising:
   providing a trench within a peripheral recess formed within a marginal portion of a support frame for said stack;
   applying an excess amount of adhesive to one of said planar components;
   bringing said upper and lower planar components into proximity such that said adhesive layer of well-defined thickness is formed between said upper and lower planar components; and
   collecting surplus adhesive in said trench.

2. The method as claimed in claim 1, wherein the lower component is a silicon substrate.

3. The method as claimed in claim 2, wherein the peripheral trench is linear.

4. The method as claimed in claim 2, wherein the peripheral trench is formed on opposite sides of the support frame.

5. The method as claimed in claim 2, wherein the support frame is made of aluminum.

6. The method as claimed in claim 5, wherein the peripheral trench is milled into the support frame.

7. The method as claimed in claim 6, wherein the trench is U-shaped.

8. The method as claimed in claim 6, wherein the device is an X-ray detector.

9. The method as claimed in claim 2, wherein the surplus adhesive remains in situ in the peripheral trench during a subsequent curing step.

10. The method as claimed in claim 1, wherein the trench is U-shaped.

11. The method as claimed in claim 1, wherein the device is an X-ray detector.

12. The method of claim 1. wherein in the providing step a surface of the peripheral recess formed in the marginal portion is lower than a surface of the marginal portion, the support frame being planar and includes the peripheral recess and the marginal portion.

13. The method of claim 1, wherein the providing step, the trench is formed within the peripheral recess, the peripheral recess and the formed trench configured along a pair of opposite sides of the support frame defining a rectangle.

14. An integrated device comprising:
   a planar substrate forming part of a stack bonded onto a support frame,
   an upper layer bonded onto said planar substrate by an adhesive layer of well-defined thickness, and
   wherein said support frame has peripheral recess formed in a marginal portion thereof below said planar substrate and a trench within said peripheral contains surplus adhesive.

15. The integrated device as claimed in claim 14, wherein the upper layer is an interface layer.

16. The device as claimed in claim 15, wherein the peripheral trench is located on opposite sides of the support frame.

17. A device as claimed in claim 16, wherein the trench is U-shaped.

18. A device as claimed in claim 15, wherein the trench is U-shaped.

19. The device as claimed in claim 14, wherein the peripheral trench is linear.

20. The device as claimed in claim 19, wherein the trench is milled into the support frame.

21. The device as claimed in claim 14, wherein the support frame is made of aluminum.

22. The device as claimed in claim 14, wherein the trench is U-shaped.

23. The device as claimed in claim 14, wherein the device is an X-ray detector.

24. The integrated device of claim 14, wherein a surface of the peripheral recess formed in the marginal portion is lower than a surface of the marginal portion, the support frame being planar and includes the peripheral recess and the marginal portion.

25. The integrated device of claim 14, wherein the trench is formed within the peripheral recess, the peripheral recess and the formed trench configured along a pair of opposite sides of the support frame defining a rectangle, the planar substrate positioned within the rectangle.

* * * * *